United States Patent
Ning et al.

(10) Patent No.: US 10,896,874 B2
(45) Date of Patent: Jan. 19, 2021

(54) INTERCONNECTS SEPARATED BY A DIELECTRIC REGION FORMED USING REMOVABLE SACRIFICIAL PLUGS

(71) Applicant: GLOBALFOUNDRIES Inc., Grand Cayman (KY)

(72) Inventors: Guoxiang Ning, Clifton Park, NY (US); Ruilong Xie, Niskayuna, NY (US); Lei Sun, Altamont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 28 days.

(21) Appl. No.: 16/363,585

(22) Filed: Mar. 25, 2019

(65) Prior Publication Data
US 2020/0312764 A1 Oct. 1, 2020

(51) Int. Cl.
*H01L 23/522* (2006.01)
*H01L 23/528* (2006.01)
*H01L 21/768* (2006.01)
*H01L 23/532* (2006.01)

(52) U.S. Cl.
CPC .... *H01L 23/5226* (2013.01); *H01L 21/76808* (2013.01); *H01L 21/76877* (2013.01); *H01L 23/5283* (2013.01); *H01L 23/53295* (2013.01)

(58) Field of Classification Search
CPC ............. H01L 23/5226; H01L 23/5283; H01L 23/53295
See application file for complete search history.

(56) References Cited

U.S. PATENT DOCUMENTS

| 5,372,973 | A | 12/1994 | Doan et al. | |
|---|---|---|---|---|
| 6,909,190 | B2 * | 6/2005 | Uglow | H01L 21/76807 257/759 |
| RE42,514 | E * | 7/2011 | Tsai | H01L 23/5329 257/642 |
| 8,232,200 | B1 * | 7/2012 | Oh | H01L 21/76826 438/643 |
| 2003/0092279 | A1 * | 5/2003 | Tsai | H01L 21/76811 438/718 |
| 2009/0085120 | A1 * | 4/2009 | Lu | H01L 21/31144 257/368 |
| 2010/0059887 | A1 * | 3/2010 | Ueki | H01L 21/02203 257/741 |
| 2010/0178615 | A1 | 7/2010 | Colburn et al. | |
| 2011/0291277 | A1 * | 12/2011 | Yoshimatsu | H01L 21/76834 257/751 |
| 2012/0196435 | A1 * | 8/2012 | Terada | H01L 21/76814 438/627 |

(Continued)

*Primary Examiner* — Michael Jung
(74) *Attorney, Agent, or Firm* — Thompson Hine LLP; Anthony Canale

(57) ABSTRACT

Structures that include interconnects and methods of forming structures that include interconnects. A first interconnect is formed in a first trench in an interlayer dielectric layer, and a second interconnect in a second trench in the interlayer dielectric layer. The second interconnect is aligned along a longitudinal axis with the first interconnect. A dielectric region is arranged laterally arranged between the first interconnect and the second interconnect. The interlayer dielectric layer is composed of a first dielectric material, and the dielectric region is composed of a second dielectric material having a different composition than the first dielectric material.

13 Claims, 10 Drawing Sheets

(56) References Cited

U.S. PATENT DOCUMENTS

2012/0211837 A1     8/2012   Baars et al.
2012/0248609 A1*   10/2012   Tomita .............. H01L 21/76804
                                                                                                       257/751
2016/0276260 A1*    9/2016   Liou ................. H01L 23/53295

* cited by examiner

INTERCONNECTS SEPARATED BY A DIELECTRIC REGION FORMED USING REMOVABLE SACRIFICIAL PLUGS

BACKGROUND

The present invention relates to semiconductor device fabrication and integrated circuits and, more specifically, to structures that includes interconnects and methods of forming structures that include interconnects.

Back-end-of-line and middle-of-line interconnect structures may be used to connect device structures, which were fabricated on a substrate during front-end-of-line processing, with each other and with the environment external to the chip. The interconnect structure may include interconnects in the form of vias and interconnect segments that are used, for example, as a via chain to connect a gate contact of a transistor with a source/drain contact of another transistor. These types of interconnects may be found in a memory cell, such as a memory cell for static random access memory. A via chain may be formed by a damascene process. In a memory cell for static random access memory, the via chains for adjacent inverters may be arranged tip-to-tip in close proximity. As the tip-to-tip spacing shrinks, the probability increases that the interconnects will be shorted at their tips or ends near the vias when the via chain is formed.

Improved structures that include interconnects and methods of forming structures that include interconnects are therefore needed.

SUMMARY

In an embodiment of the invention, a structure includes an interlayer dielectric layer, a first interconnect in a first trench in the interlayer dielectric layer, and a second interconnect in a second trench in the interlayer dielectric layer. The second interconnect is aligned along a longitudinal axis with the first interconnect. The structure further includes a dielectric region laterally arranged between the first interconnect and the second interconnect. The interlayer dielectric layer is composed of a first dielectric material, and the dielectric region is composed of a second dielectric material having a different composition than the first dielectric material.

In an embodiment of the invention, a method includes forming a first via opening and a second via opening in an interlayer dielectric layer, forming a first sacrificial plug in the first via opening and a second sacrificial plug in the second via opening, and forming an open space extending partially through the interlayer dielectric layer between the first sacrificial plug and the second sacrificial plug. A dielectric material is deposited in the open space to define a dielectric region. The method further includes forming a first trench in the interlayer dielectric layer over a portion of the first via opening and a second trench in the interlayer dielectric layer over a portion of the second via opening. After depositing the dielectric material in the open space, the first sacrificial plug and the second sacrificial plug are removed. A first interconnect feature is formed in the first trench and the first via opening, and a second interconnect feature is formed in the second trench and the second via opening. A portion of the first interconnect feature is separated from a portion of the second interconnect feature by the dielectric region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

FIG. 11 is a top view taken in which FIG. 10 is taken generally along line 10-10.

DETAILED DESCRIPTION

Figure 1:
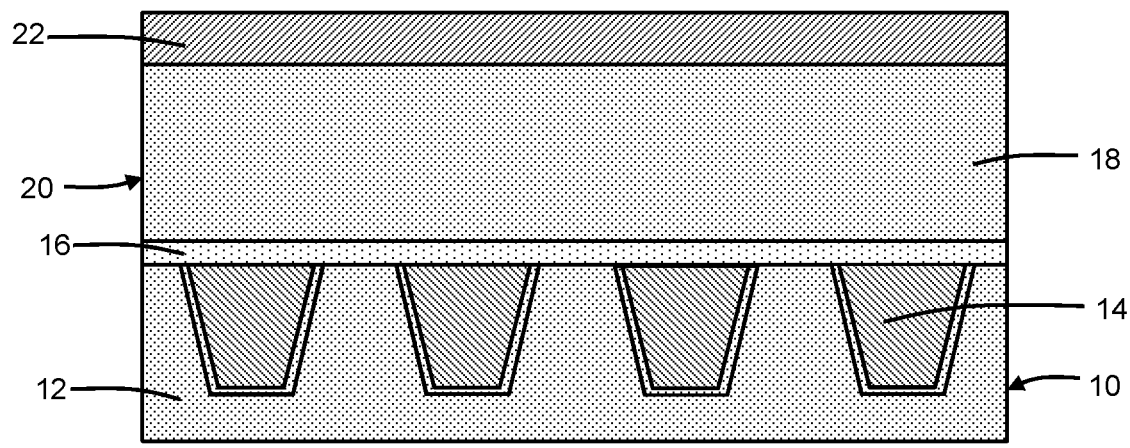
FIGS. 1-10 are cross-sectional views of a structure at successive fabrication stages of a processing method in accordance with embodiments of the invention.

With reference to FIG. 1 and in accordance with embodiments of the invention, a metallization level 10 may include an interlayer dielectric layer 12 and interconnects 14 that are embedded in the interlayer dielectric layer 12. The interlayer dielectric layer 12 may be composed of an electrically-insulating dielectric material. In an embodiment, the interlayer dielectric layer 12 may be composed of an ultra-low-k dielectric material, such as porous SiCOH, having a dielectric constant of less than or equal to 2.5. The interlayer dielectric layer 12 may be located over a layer (not shown) that may include device structures fabricated by front-end-of-line (FEOL) processing using a semiconductor wafer to form an integrated circuit. In an embodiment, the metallization level 10 may be the closest of multiple metallization levels of a back-end-of-line (BEOL) interconnect structure to the device structures, and in which the interconnects 14 may be connected with the device structures by contacts in an intervening contact level.

The interconnects 14 may be formed in trenches patterned by lithography and etching processes in the interlayer dielectric layer 12, and may be constituted by a set of uncut parallel metal lines. The interconnects 14 may include a primary conductor that is composed of a low-resistivity metal formed using a deposition process, such as copper or cobalt deposited by, for example, electroless deposition or chemical vapor deposition. A liner composed of titanium, titanium nitride, tantalum, tantalum nitride, or a layered combination of these materials (e.g., a bilayer of tantalum nitride and tantalum) may be applied to the trenches before filling with a primary electrical conductor.

An interlayer dielectric layer 18 of a metallization level 20 is arranged over the metallization level 10. The interlayer dielectric layer 18 may be composed of the same dielectric material as the interlayer dielectric layer 12. A cap layer 16 is arranged between the interlayer dielectric layer 18 and the metallization level 10. The cap layer 16 is composed of a dielectric material that has a different composition than the dielectric material of the interlayer dielectric layers 12, 18. In an embodiment, the dielectric material of the cap layer 16 may be composed of silicon carbon nitride (SiCN) (e.g., nitrogen-doped silicon carbide), commonly known as NBloK, deposited by chemical vapor deposition. Alternatively, the cap layer 16 may be composed of silicon nitride. The cap layer 16 provides an etch stop that protects the interlayer dielectric layer 12 from etching and lithography processes used to form via openings and trenches (not shown) in other locations in the interlayer dielectric layer 12, as well as acting as a barrier diffusion layer for atomic metal residues on the top surface of the interlayer dielectric layer 12.

A hardmask 22 is arranged over the interlayer dielectric layer 18 of the metallization level 20. The hardmask 22 may be composed of a metal, such as titanium nitride.

Figure 2:
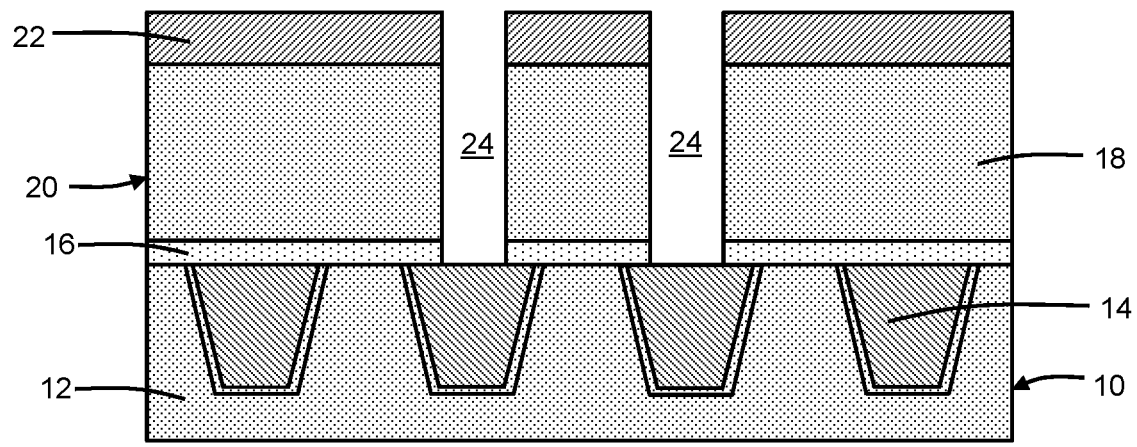

With reference to FIG. 2 in which like reference numerals refer to like features in FIG. 1 and at a subsequent fabrication stage of the processing method, the hardmask 22, the interlayer dielectric layer 18, and the cap layer 16 may be patterned by lithography and etching processes to provide via openings 24 that extend to an adjacent pair of the interconnects 14.

Figure 3:
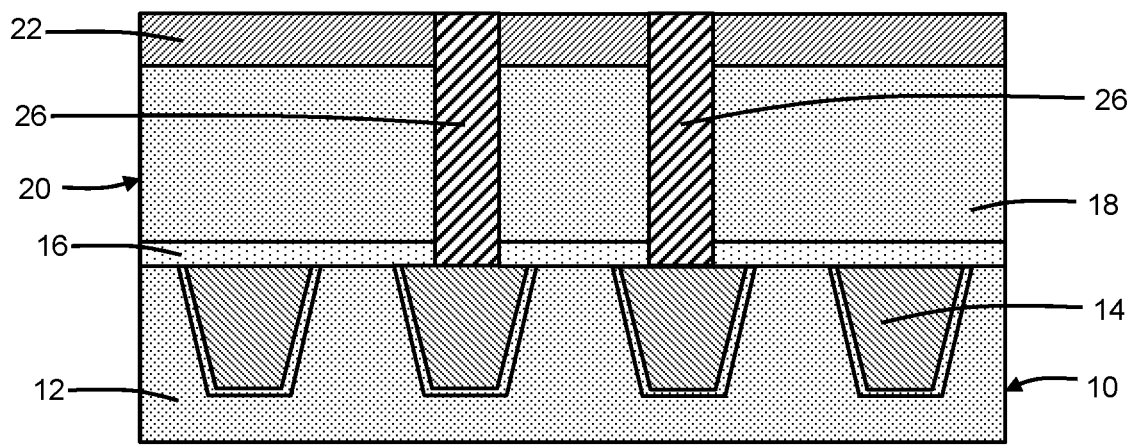

With reference to FIG. 3 in which like reference numerals refer to like features in FIG. 2 and at a subsequent fabrication stage of the processing method, sacrificial plugs 26 are formed in the via openings 24. The sacrificial plugs 26 may be composed of a material having etch selectivity relative to the hardmask 22. In an embodiment, the sacrificial plugs 26 may be composed of amorphous silicon that is deposited and etched back to remove any overburden deposited over the top surface of the hardmask 22. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process.

Figure 4:
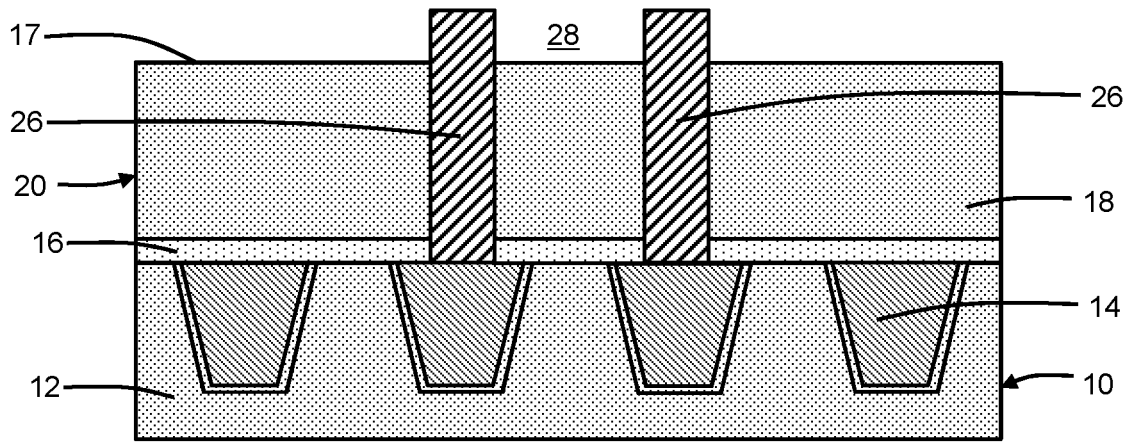

With reference to FIG. 4 in which like reference numerals refer to like features in FIG. 3 and at a subsequent fabrication stage of the processing method, the hardmask 22 may be removed by an etching process that removes the hardmask 22 selective to the materials of the interlayer dielectric layer 18 and the sacrificial plugs 26. The sacrificial plugs 26 include exposed upper portions that project above a top surface 17 of the interlayer dielectric layer 18 and covered lower portions that are buried within the cap layer 16 and interlayer dielectric layer 18. The removal of the hardmask 22 provides an open space 28 as a gap between the upper portions of the sacrificial plugs 26 that are revealed by its removal. A portion of the top surface 17 of the interlayer dielectric layer 18 is exposed inside the open space 28 between the upper portions of the sacrificial plugs 26.

Figure 5:
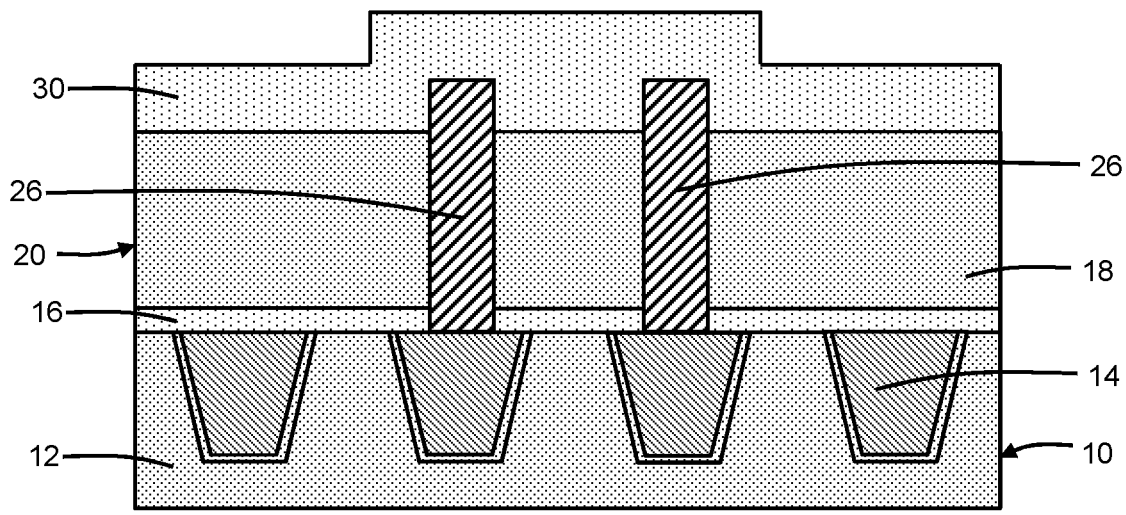

With reference to FIG. 5 in which like reference numerals refer to like features in FIG. 4 and at a subsequent fabrication stage of the processing method, a dielectric layer 30 is deposited over the interlayer dielectric layer 18 and the sacrificial plugs 26. The dielectric layer 30 is composed of a dielectric material. In an embodiment, the dielectric material of the dielectric layer 30 may be silicon nitride having a dielectric constant of about 7.5 In an embodiment, the dielectric material of the dielectric layer 30 may have a dielectric constant of greater than or equal to 3.9. The dielectric layer 30 may be conformally deposited by atomic layer deposition, and may pinch off inside the open space 28 (FIG. 4) as the dielectric material deposits on and coats the exposed side surfaces of the sacrificial plugs 26 and the top surface of the interlayer dielectric layer 18 between the sacrificial plugs 26. As the thickness of the dielectric layer 30 increases during deposition, the thickening dielectric material advancing from the different surfaces merges to provide the pinch off.

Figure 6:
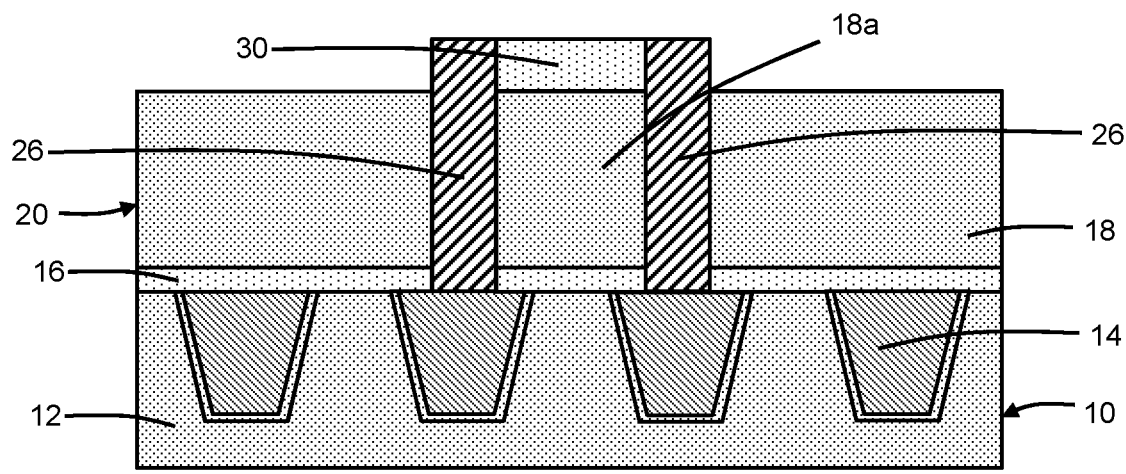

With reference to FIG. 6 in which like reference numerals refer to like features in FIG. 5 and at a subsequent fabrication stage of the processing method, an etching process is applied to remove the dielectric layer 30 from the surfaces of the interlayer dielectric layer 18 and the sacrificial plugs 26 with the exception of the portion of the dielectric layer 30 inside the open space 28. The portion of the dielectric layer 30 defines a dielectric region laterally arranged between the upper portions of the sacrificial plugs 26. In an embodiment, the dielectric region provided the portion of the dielectric layer 30 is only arranged between the upper portions of the sacrificial plugs 26. The etching process, which may be an isotropic etching process, removes the material of the dielectric layer 30 selective to the materials of the interlayer dielectric layer 18 and the sacrificial plugs 26. The presence of the upper portions of the sacrificial plugs 26 and the dimensions of the open space 28 promote the retention of the portion of the dielectric layer 30 inside the open space 28. The formation of the portion of the dielectric layer 30 is self-aligned to the upper portions of the sacrificial plugs 26. A portion 18a of the interlayer dielectric layer 18 is arranged directly beneath the portion of the dielectric layer 30 providing the dielectric region and is also arranged laterally between the sacrificial plugs 26.

Figure 7:
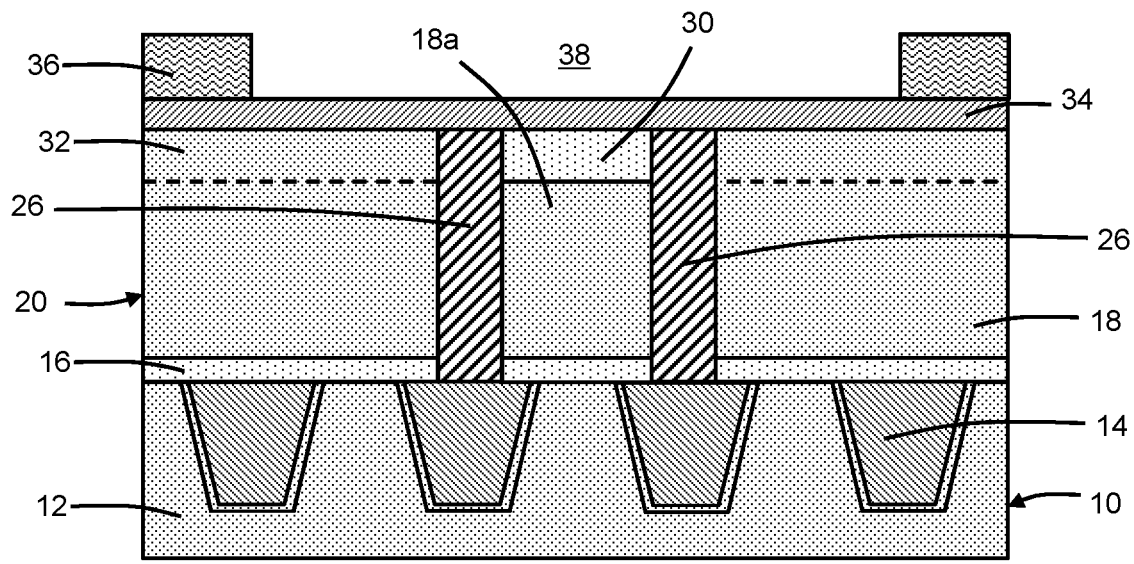

With reference to FIG. 7 in which like reference numerals refer to like features in FIG. 6 and at a subsequent fabrication stage of the processing method, dielectric layer 32 is deposited to reestablish the thickness of the interlayer dielectric layer 18 about the upper portions of the sacrificial plugs 26 and the remaining portion of the dielectric layer 30 laterally between the upper portions of the sacrificial plugs 26. The dielectric material of the dielectric layer 32 may have the same composition as the dielectric material of the interlayer dielectric layer 18 and constitute an added portion of the interlayer dielectric layer 18. Following its deposition, the dielectric layer 32 is then planarized with chemical mechanical polish to reestablish a flat top surface. The planarization exposes the sacrificial plugs 26 at the flat top surface and subsequently facilitates their removal.

A hardmask 34 is formed over the interlayer dielectric layer 18, the sacrificial plugs 26, and the portion of the dielectric layer 30 laterally between the upper portions of the sacrificial plugs 26. The hardmask 34 may be composed of a metal, such as titanium nitride.

An etch mask 36 is formed over the hardmask 34 and lithographically patterned. The etch mask 36 may include an organic planarization layer (OPL) that is applied as a spin-on hardmask, an anti-reflection coating, and a photoresist that are patterned by lithography and etching processes to provide an opening 38 arranged generally over the sacrificial plugs 26 and the portion of the dielectric layer 30 laterally between the upper portions of the sacrificial plugs 26. The opening 38 is wider than the total width of the sacrificial plugs 26 and the portion of the dielectric layer 30 laterally between the sacrificial plugs 26.

Figure 8:
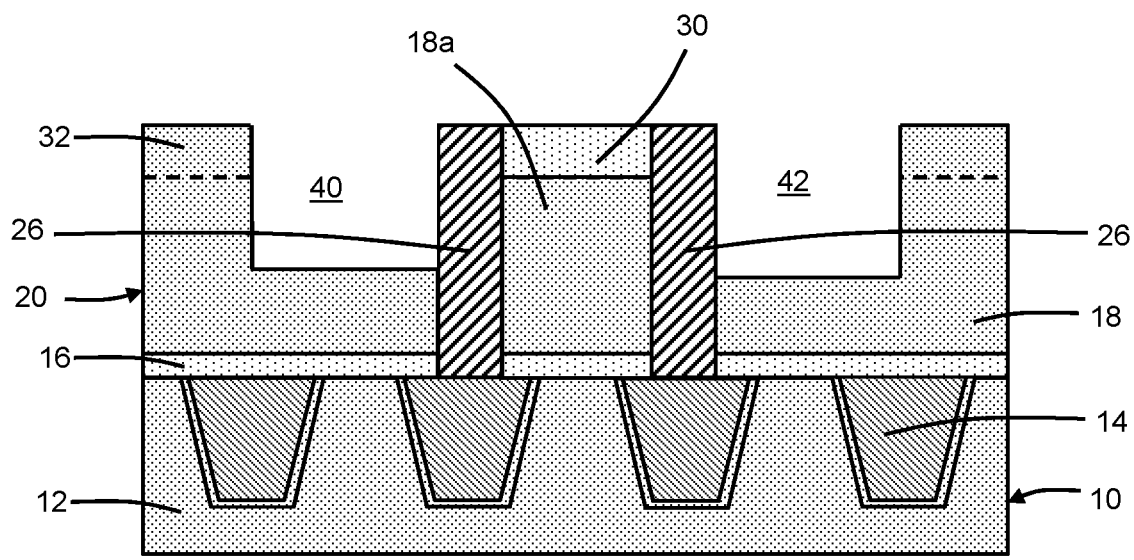

With reference to FIG. 8 in which like reference numerals refer to like features in FIG. 7 and at a subsequent fabrication stage of the processing method, trenches 40, 42 are formed by an etching process in the interlayer dielectric layer 18. To that end, the opening 38 is transferred by an etching process from the etch mask 36 to the hardmask 34 and subsequently removed, and the trenches 40, 42 are then etched followed by the removal of the hardmask 34. The etching process, which may be a reactive ion etching process, may remove the material of the interlayer dielectric layer 18 selective to the materials of the sacrificial plugs 26 and the dielectric layer 30, and the trenches 40, 42 may extend only partially through the thickness of the interlayer dielectric layer 18. The etching process is self-aligned by the upper portions of the sacrificial plugs 26 and the portion of the dielectric layer 30 between the upper portions of the sacrificial plugs 26. Interconnects are subsequently formed in the trenches 40, 42.

Figure 9:
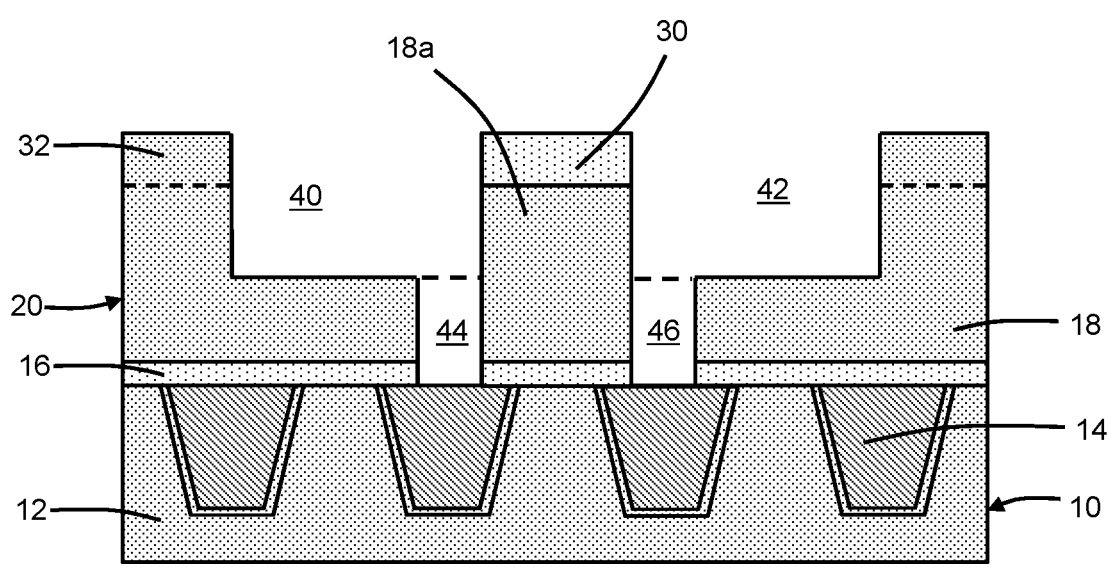

With reference to FIG. 9 in which like reference numerals refer to like features in FIG. 8 and at a subsequent fabrication stage of the processing method, the sacrificial plugs 26 are fully removed. The removal of the upper portions of the sacrificial plugs 26 eliminates obstructions in the trenches 40, 42. The removal of the lower portions of the sacrificial plugs 26 defines respective via openings 44, 46 that extend fully through the thickness of the interlayer dielectric layer 18 beneath the trenches 40, 42 and the thickness of the cap layer 16 to provide paths to respective interconnects 14 in the lower metallization level 10. The etching process pulling the sacrificial plugs 26 may remove the materials of the cap layer 16 and interlayer dielectric layer 18 selective to the material of the dielectric layer 30.

The trench 40 and the via opening 44 may be considered to collectively constitute components of a unitary interconnect opening in which a portion of the interconnect opening adjacent to the portion of the dielectric layer 30 and associated with the via opening 44 has a greater depth. Similarly, the trench 42 and the via opening 46 may be considered to collectively constitute components of another unitary interconnect opening in which a portion of the interconnect opening adjacent to the portion of the dielectric layer 30 and associated with the via opening 46 has a greater depth.

Figure 10:
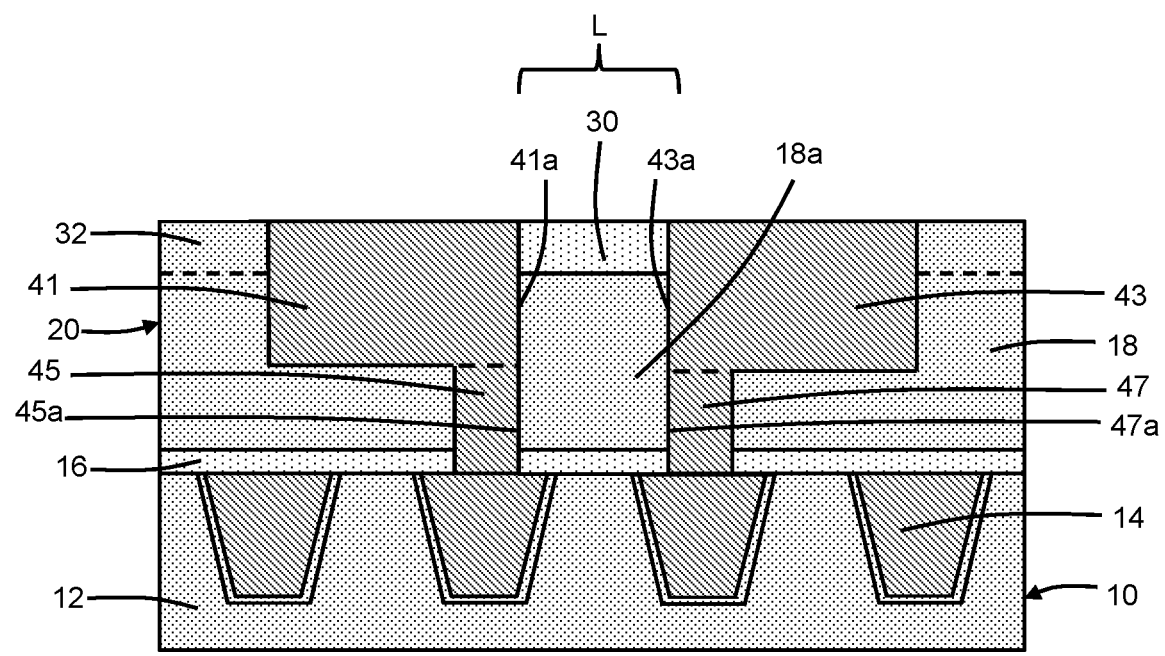
Figure 11:
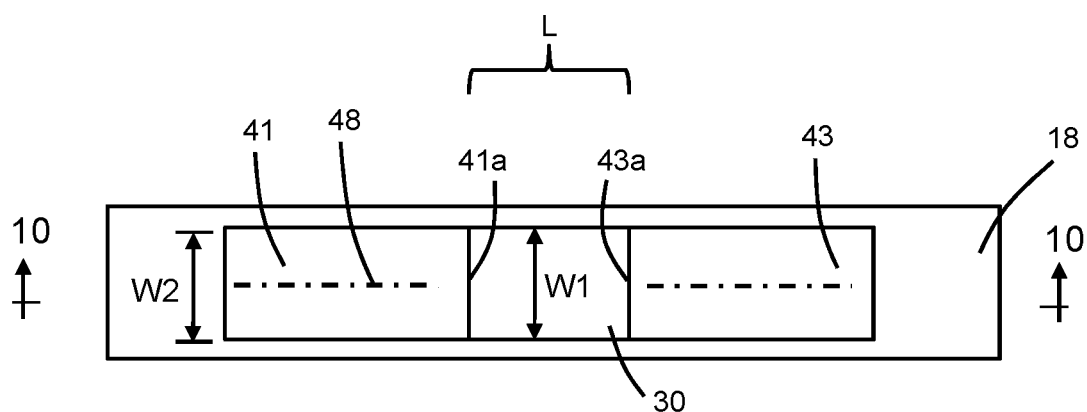

With reference to FIGS. 10, 11 in which like reference numerals refer to like features in FIG. 9 and at a subsequent fabrication stage of the processing method, an interconnect 41 and a via 45 are respectively formed in the trench 40 and via opening 44, and an interconnect 43 and a via 47 are respectively formed in the trench 42 and via opening 46. The primary conductor of the interconnects 41, 43 and vias 45, 47 may be composed of a low-resistivity metal formed using a deposition process, such as copper or cobalt deposited by, for example, electroplating or electroless deposition or chemical vapor deposition. A barrier/liner (not shown) composed of titanium, titanium nitride, tantalum, tantalum nitride, or a layered combination of these materials (e.g., a bilayer of tantalum nitride and tantalum) may be applied to the surfaces of the trenches 40, 42 and vias 45, 47 before filling with a primary electrical conductor.

The interconnect 41 is terminated by an end surface 41a adjacent to the portion of the dielectric layer 30, and the interconnect 43 is terminated by an end surface 43a also adjacent to the portion of the dielectric layer 30. The interconnects 41, 43 may be in direct contact with the dielectric region defined by the portion of the dielectric layer 30 with the portion of the dielectric layer 30 arranged directly between the terminating end surfaces 41a, 43a. The terminating end surface 41a of the interconnect 41 may be arranged in direct contact with the portion of the dielectric layer 30, and the terminating end surface 43a of the interconnect 43 may be arranged in direct contact with the portion of the dielectric layer 30. The interconnects 41, 43 are arranged over the vias 45, 47 and the vias 45, 47 are arranged in the vertical direction between the interconnects 41, 43 and the interconnects 14 as a consequence of the arrangement in the vertical direction of the trenches 40, 42 and the via openings 44, 46.

As best shown in FIG. 11, the interconnects 41, 43 are aligned along a longitudinal axis 48. The interconnect 41 is separated from the interconnect 43 by the dielectric region provided by the portion of the dielectric layer 30 and the portion 18a of the interlayer dielectric layer 18. The portion of the dielectric layer 30 has a length dimension, L, and the interconnects 41, 43 are separated by a tip-to-tip spacing, S, that is equal or substantially equal to the length dimension, L. The interconnects 41, 43 and their trenches 40, 42 also have a width dimension, W2, in a direction transverse to the longitudinal axis 48. The portion of the dielectric layer 30 may have a width, W1, that is substantially equal to the width, W2, of the interconnects 41, 43 and their trenches 40, 42. The width of the interconnects 41, 43 is established by the width of the sacrificial plugs 26, which establishes the width of the via openings 44, 46, in conjunction with the etching of the trenches 40, 42. The interconnects 41, 43 and the portion of the dielectric layer 30 are surrounded the interlayer dielectric layer 18.

The via 45 is terminated by a side surface 45a that is adjacent to the portion 18a of the interlayer dielectric layer 18, and the via 47 has a side surface 47a that is also adjacent to the portion 18a of the interlayer dielectric layer 18. The vias 45, 47 may be in direct contact with the dielectric region further defined by the portion 18a of the interlayer dielectric layer 18 arranged between the terminating side surfaces 45a, 47a. The via 45 is also separated from the via 47 by a portion of the cap layer 16 underlying the portion 18a of the interlayer dielectric layer 18. The dimensions of the vias 45, 47 are established by the dimensions of the lower portions of the sacrificial plugs 26. The terminating side surfaces 45a, 47a of the vias 45, 47 are also separated by the tip-to-tip spacing, S. In an embodiment, the vias 45, 47 and the via openings 44, 46 may also have the width, W2, that is substantially equal to the width, W1, of the dielectric region.

The process flow, in accordance with the various embodiments of the invention, relies on the presence of the portion of the dielectric layer 30 to provide a definite tip-to-tip spacing between the adjacent interconnects 41, 43 and vias 45, 47, which are separated by dielectric region provided by the portion of the dielectric layer 30 and the portion 18a of the interlayer dielectric layer 18. The use of the sacrificial plugs 26 as placeholder structures in the via openings 44, 46 constrains the placement of the vias 45, 47 to have the same spacing as the tip-to-tip spacing. No portion of either of the vias 45, 47 is located inside an enclosure including the dielectric region.

The interconnect 41 and via 45 may be considered to collectively constitute components of a unitary interconnect feature in which a portion is located inside the trench 40 and another portion is located inside the via opening 44. Similarly, the interconnect 41 and via 45 may be considered to collectively constitute components of a unitary interconnect feature in which a portion is located inside the trench 42 and another portion is located inside the via opening 46. The interconnect features are separated in part by the portion of the dielectric layer 30, in part by the portion 18a of the interlayer dielectric layer 18, and in part by the portion of the cap layer 16 underlying the portion 18a of the interlayer dielectric layer 18 to provide the tip-to-tip spacing.

Figure 12:
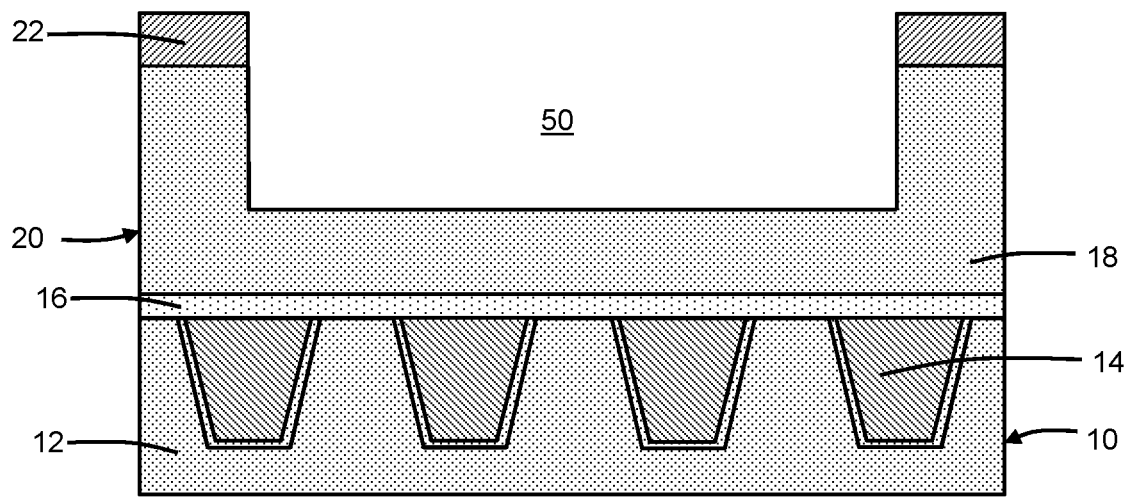
FIGS. 12-19 are cross-sectional views of a structure at successive fabrication stages of a processing method in accordance with alternative embodiments of the invention.

With reference to FIG. 12 in which like reference numerals refer to like features in FIG. 1 and in accordance with alternative embodiments, the hardmask 22 and interlayer dielectric layer 18 may be patterned by lithography and etching processes that forms a trench 50 in the hardmask 22 and then transfers the trench 50 in a vertical direction from the hardmask 22 to the interlayer dielectric layer 18. The trench 50 extends only partially through the interlayer dielectric layer 18.

Figure 13:
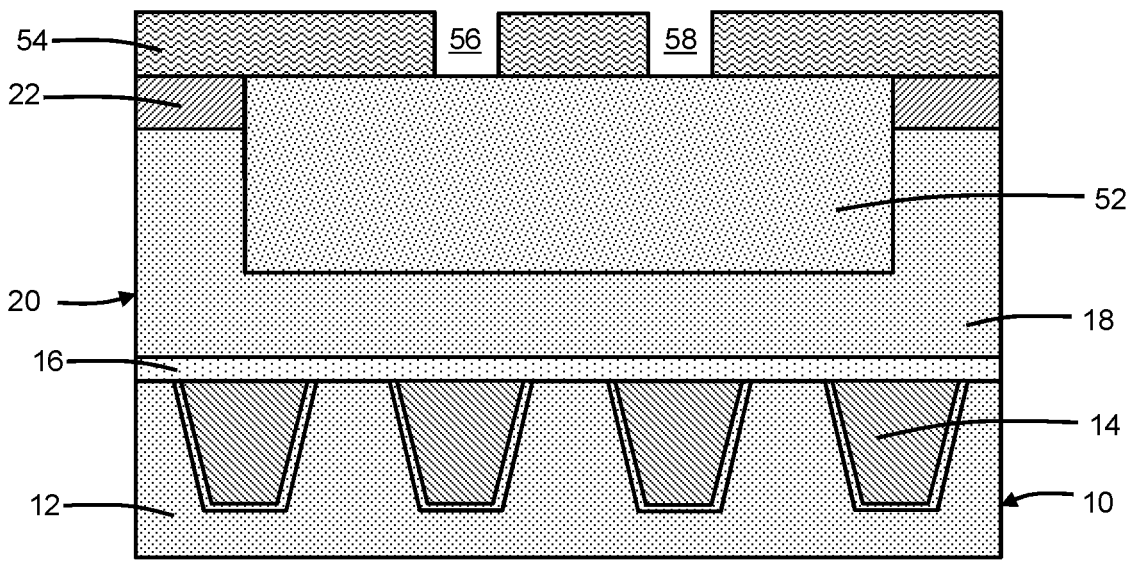

With reference to FIG. 13 in which like reference numerals refer to like features in FIG. 12 and at a subsequent fabrication stage of the processing method, a sacrificial layer 52 is formed inside the trench 50. The sacrificial layer 52 may be composed of a sacrificial material, such as amorphous carbon (α-C), that is deposited by chemical vapor deposition and planarized with chemical mechanical polishing or an etch-back. An etch mask 54 is formed over the planarized hardmask 22 and sacrificial layer 52, and then lithographically patterned. The etch mask 54 may include an organic planarization layer (OPL) that is applied as a spin-on hardmask, an anti-reflection coating, and a photoresist that are patterned by lithography and etching processes to provide openings 56, 58 arranged generally over the interconnects 14 to be contacted from above. The opening 56, 58 are each narrower in width than the trench 50 (FIG. 12).

Figure 14:
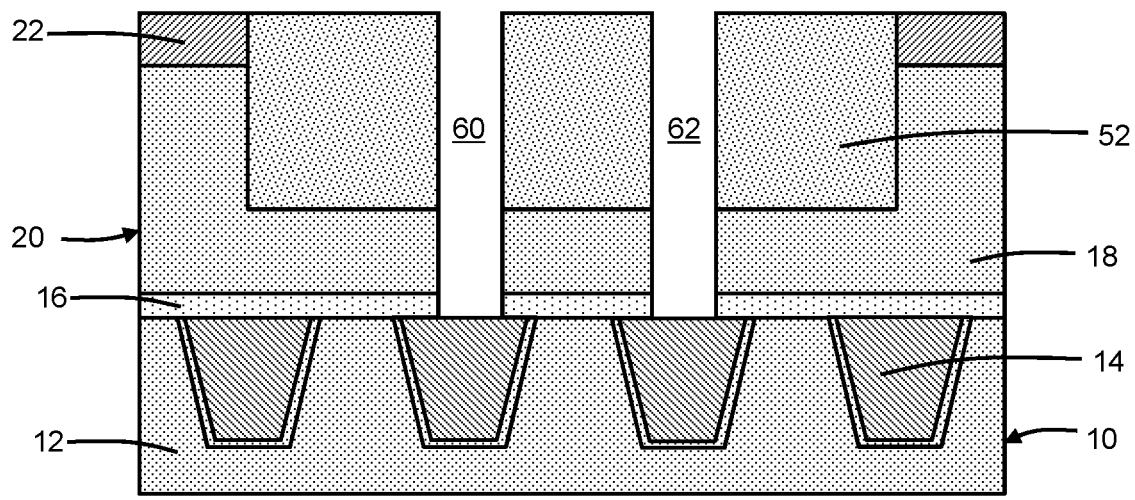

With reference to FIG. 14 in which like reference numerals refer to like features in FIG. 13 and at a subsequent fabrication stage of the processing method, via openings 60, 62 are formed inside the boundary of the trench 50. The via openings 60, 62 extend through the sacrificial layer 52, the section of the interlayer dielectric layer 18 beneath the sacrificial layer 52, and the cap layer 16 to respective interconnects 14 in the metallization level 10. The via openings 60, 62 may be formed by an etching process, such as reactive ion etching, at the respective locations of the openings 56, 58 in the etch mask 54 (FIG. 14).

Figure 15:
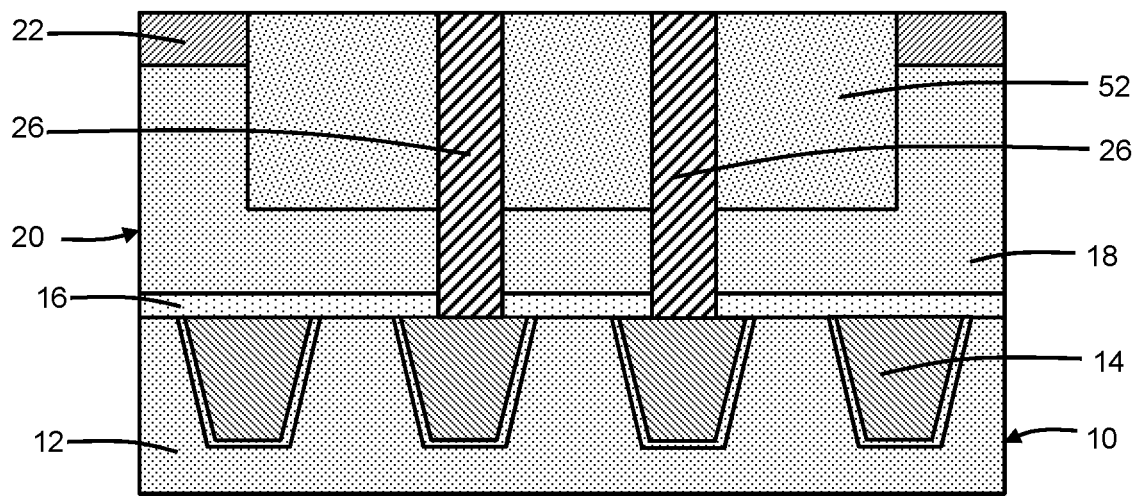

With reference to FIG. 15 in which like reference numerals refer to like features in FIG. 14 and at a subsequent fabrication stage of the processing method, the sacrificial plugs 26 are formed in the via openings 60, 62 as previously described. The material from which the sacrificial layer 52 is chosen to be removed selective to the materials of the sacrificial plugs 26 and the interlayer dielectric layer 18.

Figure 16:
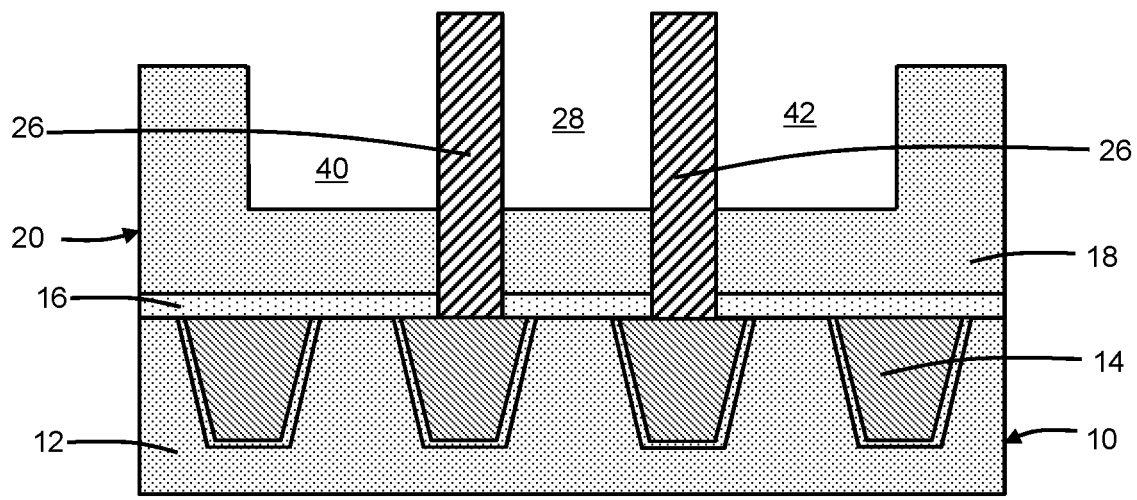

With reference to FIG. 16 in which like reference numerals refer to like features in FIG. 15 and at a subsequent fabrication stage of the processing method, the hardmask 22 and the sacrificial layer 52 are removed by an etching process that removes the hardmask 22 and the sacrificial layer 52 selective to the materials of the interlayer dielectric layer 18 and the sacrificial plugs 26. The sacrificial plugs 26 include exposed upper portions that project above the top surface 17 of the interlayer dielectric layer 18 and covered lower portions that are buried within the cap layer 16 and interlayer dielectric layer 18. The open space 28 is arranged between the upper portions of the sacrificial plugs 26, and the sacrificial plugs 26 are arranged between the open space 28 and the trenches 40, 42.

Figure 17:
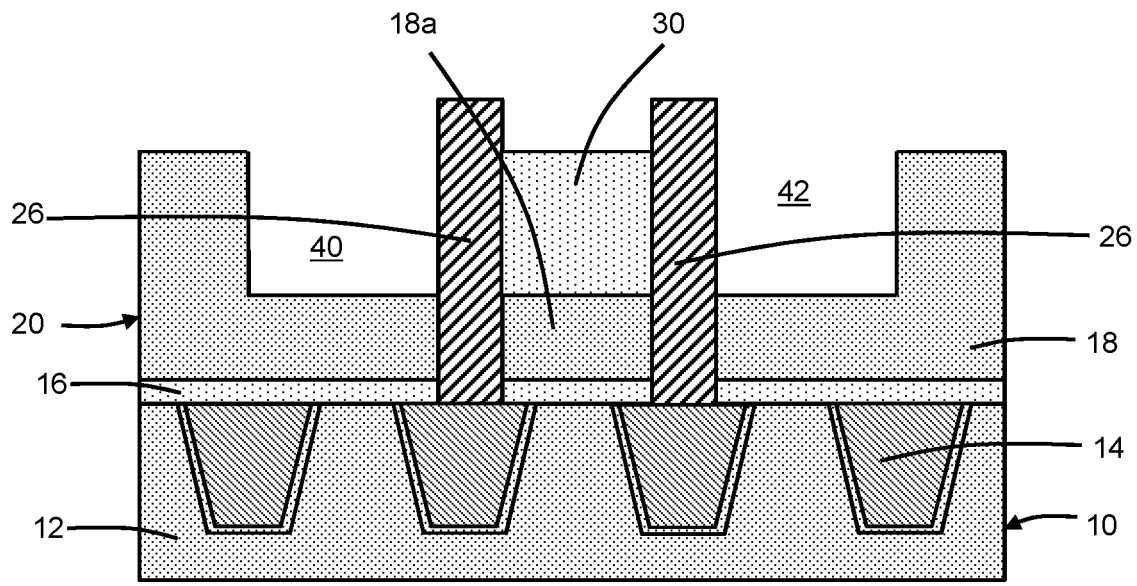

With reference to FIG. 17 in which like reference numerals refer to like features in FIG. 16 and at a subsequent fabrication stage of the processing method, the dielectric layer 30 is deposited and etched back, as previously described, such that only the portion of the dielectric layer 30 remains inside the open space 28 between the upper portions of the sacrificial plugs 26.

Figure 18:
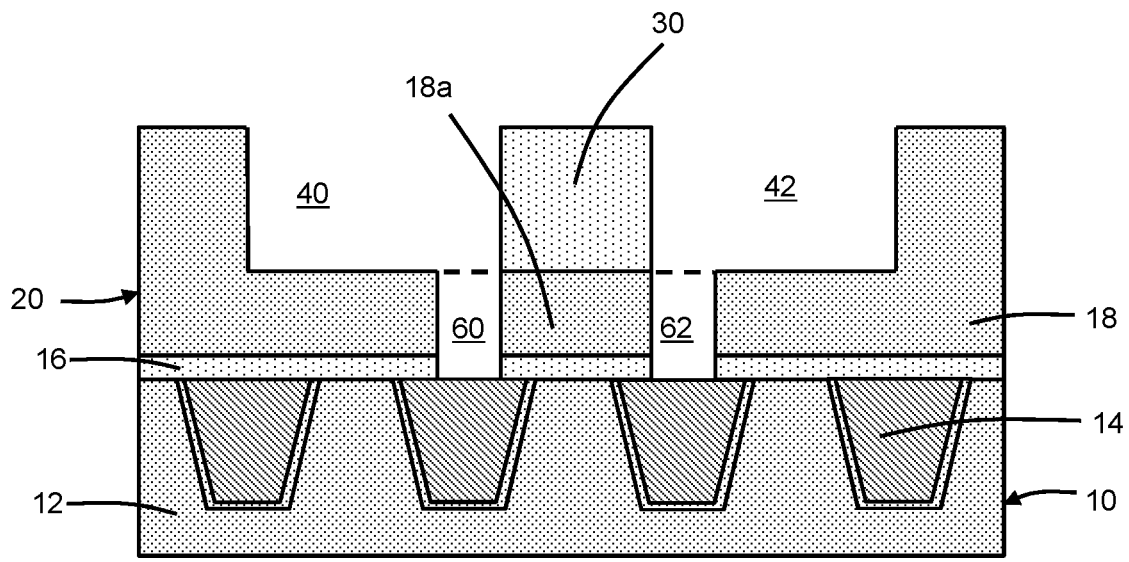

With reference to FIG. 18 in which like reference numerals refer to like features in FIG. 17 and at a subsequent fabrication stage of the processing method, the sacrificial plugs 26 are fully removed to re-open the lower portions of the via openings 60, 62, which are now similar to openings 44, 46 (FIG. 9). The portion of the dielectric layer 30 is laterally arranged between the trench 40 and the trench 42.

Figure 19:
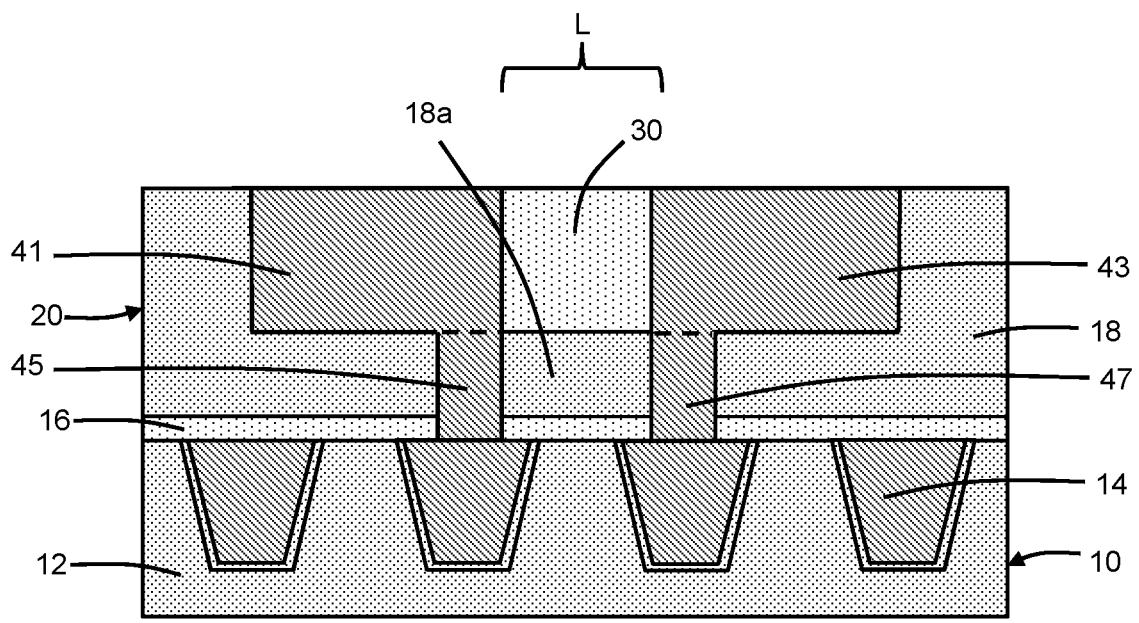

With reference to FIG. 19 in which like reference numerals refer to like features in FIG. 18 and at a subsequent fabrication stage of the processing method, the interconnects 41, 43 are formed in the trenches 49, 51 and the vias 45, 47 are respectively formed in the via openings 60, 62 after the sacrificial plugs 26 are removed. The portion of the dielectric layer 30 is laterally arranged between the interconnect 41 and the interconnect 43 of the interconnects 41, 43. The interconnects 41, 43 have a top-to-tip spacing defined by the length dimension, L, of the portion of the dielectric layer 30.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    an interlayer dielectric layer;
    a first interconnect feature in a first interconnect opening in the interlayer dielectric layer;
    a second interconnect feature in a second interconnect opening in the interlayer dielectric layer, the second interconnect feature aligned along a longitudinal axis with the first interconnect feature; and
    a dielectric region laterally arranged between a portion of the first interconnect feature and a portion of the second interconnect feature,
    wherein the portion of the first interconnect feature and the portion of the second interconnect feature are separated along the longitudinal axis by a spacing equal to a dimension of the dielectric region, the first interconnect feature and the second interconnect feature have a first width in a direction transverse to the longitudinal axis, and the dielectric region has a second width that is substantially equal to the first width, the interlayer dielectric layer is comprised of a first dielectric material, and the dielectric region is comprised of a second dielectric material having a different composition than the first dielectric material.

2. The structure of claim 1 wherein the first interconnect opening includes a first trench, the first interconnect feature includes a first interconnect in the first trench, the second interconnect opening includes a second trench, and the second interconnect feature includes a second interconnect in the second trench.

3. The structure of claim 2 wherein the first interconnect opening further includes a first via opening and the second interconnect opening further includes a second via opening, the first interconnect feature includes a first via in the first via opening, and the second interconnect feature includes a second via in the second via opening.

4. The structure of claim 3 wherein the dielectric region is arranged over a portion of the interlayer dielectric layer, and the portion of the interlayer dielectric layer is arranged laterally between the first via and the second via.

5. The structure of claim 4 wherein the first via has a side surface in direct contact with the portion of the interlayer dielectric layer, and the second via has a side surface in direct contact with the portion of the interlayer dielectric layer.

6. The structure of claim 3 further comprising:
a metallization level including a third interconnect and a fourth interconnect; and
a cap layer between the metallization level and the interlayer dielectric layer,
wherein the first via and the first via opening penetrate through the cap layer to the third interconnect, and the second via and the second via opening penetrate through the cap layer to the fourth interconnect.

7. The structure of claim 2 wherein the portion of the first interconnect feature is the first interconnect, and the portion of the second interconnect feature is the second interconnect.

8. The structure of claim 1 wherein the first dielectric material has a dielectric constant of less than or equal to 2.5, and the second dielectric material has a dielectric constant of greater than or equal to 3.9.

9. The structure of claim 1 wherein the first dielectric material has a dielectric constant of less than or equal to 2.5, and the second dielectric material is silicon nitride.

10. The structure of claim 1 wherein the dielectric region is arranged directly between the portion of the first interconnect feature and the portion of the second interconnect feature.

11. The structure of claim 1 wherein the portion of the first interconnect feature is in direct contact with the dielectric region, and the portion of the second interconnect feature is in direct contact with the dielectric region.

12. The structure of claim 1 wherein the first interconnect feature includes a first interconnect and a first via in the first interconnect opening, the second interconnect feature includes a second interconnect and a second via in the second interconnect opening, the first interconnect and the first via are in direct contact with the dielectric region, and the second interconnect and the second via are in direct contact with the dielectric region.

13. The structure of claim 12 wherein the dielectric region has a length, the first interconnect and the second interconnect are separated by a first spacing equal to the length, and the first via and the second via are separated by a second spacing equal to the length.

* * * * *